(12) United States Patent
Romanovskyy (10) Patent No.: US 8,988,921 B2
(45) Date of Patent: Mar. 24, 2015

(54) BOOSTING WORD LINES

(75) Inventor: Sergiy Romanovskyy, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 313 days.

(21) Appl. No.: 13/434,731

(22) Filed: Mar. 29, 2012

(65) Prior Publication Data

US 2013/0258744 A1 Oct. 3, 2013

(51) Int. Cl.
*G11C 5/06* (2006.01)
*G11C 8/08* (2006.01)
*G11C 11/408* (2006.01)

(52) U.S. Cl.
CPC .............. *G11C 8/08* (2013.01); *G11C 11/4085* (2013.01)
USPC .................... 365/72; 365/189.11; 365/230.06; 365/185.23

(58) Field of Classification Search
USPC ...................... 365/72, 189.11, 230.06, 185.23
See application file for complete search history.

(56) References Cited

U.S. PATENT DOCUMENTS

| 7,158,436 B2* | 1/2007 | Lee ............................ 365/226 |
| 8,259,507 B2* | 9/2012 | Joo .......................... 365/185.25 |
| 8,804,446 B2* | 8/2014 | Okahiro ....................... 365/207 |
| 2004/0027850 A1* | 2/2004 | Kang ............................ 365/145 |
| 2006/0291321 A1* | 12/2006 | Leung ..................... 365/230.06 |

OTHER PUBLICATIONS

Singh, Prashant, et al., Special Section Briefs, "Self-Timed Regenerators for High-Speed and Low-Power On-Chip Global Interconnect", IEEE Transactions on Very Large Scale Integration (VLSI) Systems, vol. 16, No. 6, Jun. 2008, pp. 673-677.

* cited by examiner

*Primary Examiner* — Toan Le
(74) *Attorney, Agent, or Firm* — Lowe Hauptman & Ham, LLP (57) ABSTRACT

In a method for boosting a word line signal, the word line signal is transitioned from a first voltage value of the word line signal to a second voltage value of the word line signal, thereby turning on a first transistor. The first transistor and a second transistor turn on a third transistor. The third transistor causes the word line signal at a first terminal of the third transistor to reach a voltage value at a second terminal of the third transistor, thereby causing the word line signal to reach the voltage value faster than without the third transistor. The first transistor and the second transistor are coupled in series.

20 Claims, 9 Drawing Sheets

|     | EN  | GPM0 | WL  | MODE |
| --- | --- | --- | --- | --- |
| 210 | VSS | =VWLP | VBB | STANDBY |
| 220 | VPP | VBB | VPP | ACTIVATED WL |
| 230 | VPP | VPP | VBB | NON-ACTIVATED WL |

|     | VWLB       | ENB | GLMN0 | WL  | MODE |
| --- | ---------- | --- | ----- | --- | ---- |
| 310 | Hi-Z (>VSS) | VDD | VWLB  | VPP | STANDBY |
| 320 | VBB        | VBB | VPP   | VBB | ACTIVATED WL |
| 330 | VBB        | VBB | VBB   | VPP | NON-ACTIVATED WL |

BOOSTING WORD LINES

FIELD

The present disclosure is related to boosting word lines of a memory array.

BACKGROUND

Word lines in dynamic random access memory (DRAM) are commonly heavily loaded. For example, in some DRAM architecture, a word line is coupled to about one thousand (1K) to four thousand (4K) memory cells. In nano-scale technologies, a width of the word lines is narrow. A resistance of the word lines is high, which causes a large propagation delay along the word lines, and affects performance of the DRAM. To solve the problem, repeaters to recover integrity of signals on the word lines may be asserted along the word lines; two-metal layers mechanisms may be used for the word lines, etc. In such solutions, disadvantages, such as inefficiency, a larger die area, additional layers, etc., however, outweigh advantages.

Commonly known, a first transistor is called stronger than a second transistor when the driving capability of the first transistor is larger than that of the second transistor. Explained in a different way, an operational current of the first transistor is higher than that of the second transistor when the voltages applied to ports of the two transistors are the same.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A word line booster circuit is used at the end of each word line in a memory array to restore the signal on the word line. As a result, the word line is capable of being coupled to additional memory cells. The memory density therefore improves. The die area for the word line booster circuit is relatively small.

Memory Array

Figure 1:
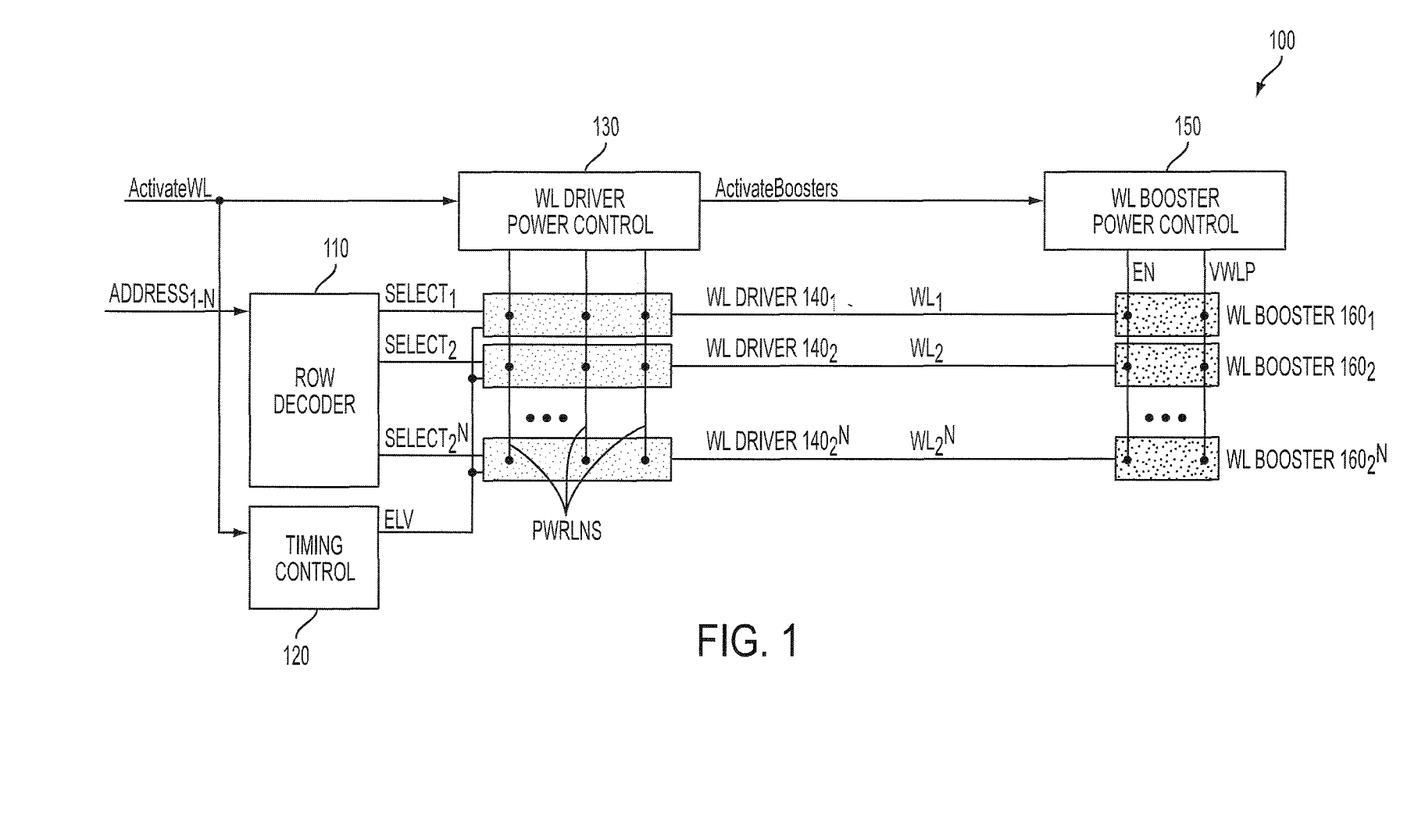
FIG. 1 is a diagram of a memory array, in accordance with some embodiments.

FIG. 1 is a diagram of a memory array 100, in accordance with some embodiments. For simplicity, a reference name is used to denote a node, a line, etc., and also a signal on the corresponding node or line. For example, the reference name WL is used to denote both a word line and a signal on the word line.

Memory array 100 includes a plurality of memory cells arranged in rows and columns. A row of memory cells is coupled to a word line. For illustration, memory array 100 includes $2^N$ rows corresponding to $2^N$ word lines labeled as word line $WL_1$ to word line $WL_{2^N}$, wherein N is an integer number representing the number of address lines. Collectively, word lines $WL_1$ to word line $WL_{2^N}$ are called word line WL.

For simplicity, memory cells coupled to word lines WL are not shown. The number of memory cells coupled to a word line WL varies and includes, for example, 1024, 2048, 4096, etc. Various embodiments of the disclosure are not limited by the number of memory cells coupled to a word line WL.

A word line (WL) driver circuit generates a word line signal on a corresponding word line WL. Memory array 100 includes $2^N$ word lines, and hence $2^N$ WL driver circuits, which are labeled as WL driver circuit $140_1$ to $140_{2^N}$. Collectively, WL driver circuits $140_1$ to $140_{2^N}$ are called WL driver circuits 140.

In various situations, a signal on a word line WL is degraded, especially the signal that has traveled from the output of a WL driver circuit 140 along the corresponding word line WL. In some embodiment, the output of a WL driver circuit 140 is considered the beginning of a word line WL. At the end of the word line WL, such as at the last memory cell in a row coupled to the word line WL, the signal is worst. Word line boosters are used to boost the degraded signals on the word lines WL. In some embodiments, memory array 100 includes $2^N$ word lines WL, and hence $2^N$ WL booster circuits, which are labeled as WL booster circuits $160_1$ to $160_{2^N}$. Collectively, WL booster circuits $160_1$ to $160_{2^N}$ are called WL booster circuits 160. Details of a WL booster circuit 160 are explained with reference to FIGS. 2A and 3A.

In some embodiments, WL booster circuits 160 are each located at the end of a corresponding word line WL. For example, output of WL driver $140_1$ is considered the beginning of word line $WL_1$. Memory cells are coupled to word line $WL_1$. The end of word line $WL_1$ is coupled to the input of a corresponding WL booster circuit $160_1$, and there is no memory cell after the WL booster circuit $160_1$. In such a condition, various embodiments of the disclosure are advantageous because, in those embodiments, memory cells in an array have had their corresponding layouts. Placing WL booster circuits 160 at the end of word lines WL avoids area penalty related to complicated layout of the memory array.

Embodiments of the disclosure, however, are not limited to the location of WL booster circuits 160. Different locations of WL booster circuits 160, such as at ¼, ⅓, or ½, a length of the word line are within the scope of various embodiments. In some embodiments, one word line WL is activated. Word lines WL in other memory rows are deactivated and stay at voltage VBB.

Row decoder circuit 110 generates signals $SELECT_1$ to $SELECT_{2^N}$ based on $2^N$ addresses decoded from N number of address lines labeled as $Address_{1...N}$. Each signal SELECT is to select one word line WL out of $2^N$ word lines WL.

Timing control circuit 120 generates enable signal ELV based on signal ActivateWL. In some embodiments, signal ELV is in the VDD domain in which a high logical value is voltage VDD and a low logical value is voltage VSS. Circuit 120 issues signal ELV after signal SELECT corresponding to the selected word line WL is stable.

Word line driver power control circuit 130 provides corresponding voltages to the power lines PWRLNS for circuit 100 to operate in different modes, such as in a normal operational mode or a standby mode.

WL driver power control circuit 130 also generates signal ActivateBoosters to activate WL booster power control circuit 150. WL booster power control circuit 150 switches control line EN and power line VWLP in WL boosters 160 in a column, from a standby mode to an active mode based on signal ActivateBoosters.

Word Line Driver Booster Circuit

Figure 2A:
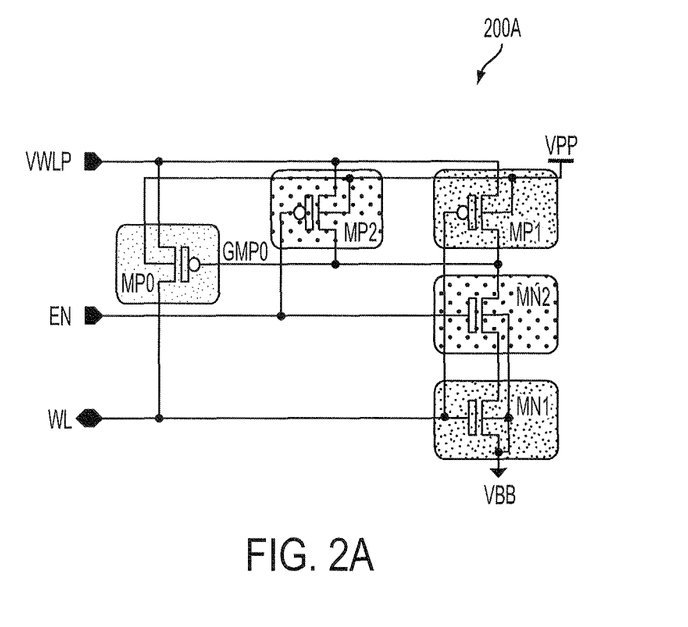
FIG. 2A is a diagram of word line booster circuit, in accordance with some embodiments.

FIG. 2A is a diagram of a word line driver booster circuit 200A illustrating a WL booster circuit 160 in FIG. 1, in accordance with some embodiments. Circuit 200A boosts signal WL when signal WL transitions from a low logical value to a high logical value. In embodiments that signal WL is activated when signal WL is logically high, circuit 200A is used in activating signal WL. In embodiments that signal WL is activated when signal WL is logically low, circuit 200A is used in deactivating signal WL. For illustration, voltage VDD (not labeled) is the normal operational voltage and voltage VSS (not labeled) is the normal reference voltage of a circuit. In some embodiments, the low logical value for signal WL is voltage VBB, which is lower than voltage VSS, and the high logical value for signal WL is voltage VPP, which is higher than voltage VDD. To adapt to the voltage swing of signal WL from voltage VBB and VPP, transistors MN1, MN2, MP0, MP1, and MP2 each have a thick gate oxide, and each have an operational voltage significantly higher than the operational voltage of core transistors, which have a thin gate oxide. In some embodiments, the voltage drop between the gate and the source and between the gate and the drain of transistors MN1, MN2, MP0, MP1, and MP2 can be as high as 2.0 V. In contrast, the voltage drop between the gate and the source and between the gate and the drain of core transistors do not exceed 1 V. Signals VWLP and EN are each common to all WL boosters 160 in FIG. 1.

PMOS transistor MP0 functions as a driver and a booster for signal WL. For example, when transistor MP0 is turned on, signal WL at the drain of PMOS transistor MP0 is pulled to signal VWLP at the source of transistor MP0. At that time, signal VWLP is at voltage VPP. In other words, transistor MP0 drives signal WL to voltage VPP, and thereby boosts signal WL. In some embodiments, transistor MP0 is turned on to drive and thus boost signal WL based on the voltage level of signal WL. For example, a WL driver circuit 140 provides signal WL transitioning from a low voltage value of voltage VBB toward a high voltage value of voltage VPP. At that time, NMOS transistor MN1 is also turned on. When signal WL reaches the threshold voltage of NMOS transistor MN1, the current through transistor MN1 increases and the current through PMOS transistor MP1 decreases. When signal WL reaches high voltage VPP, PMOS transistor MP1 is turned off completely and NMOS transistor MN1 is turned on completely. As a result, signal GMP0 at the drain of NMOS transistor MN2 is pulled to voltage VBB at the source of transistor MN1. Signal GMP0 is also at the gate of PMOS transistor MP0. Transistor MP0 is therefore turned on to boost signal WL.

PMOS transistor MP2 and NMOS transistor MN2 together function as control devices. The gates of PMOS transistor MP2 and NMOS transistor MN2 are coupled together, and are configured to receive signal EN. As a result, based on the voltage level of signal EN, when PMOS transistor MP2 is on, NMOS transistor MN2 is off, and vice versa. For example, when signal EN is logically high PMOS transistor MP2 is turned off, and is electrically disconnected from other circuits in WL booster circuit 200A. Signal GMP0 at the gate of transistor MP0 is independent of transistor MP2 and voltage VWLP. At the same time, transistor MN2 is turned on to electrically connect transistors MP1 and MN1 for transistors MP1 and MN1 to perform their functions. For example, when both NMOS transistors MN1 and MN2 are on, and PMOS transistor MP1 is off, NMOS transistors MN1 and MN2 pull signal GMP0 at the source of transistor MN2 to voltage VBB at the source of transistor MN1.

When signal EN is logically low, however, transistor MN2 is turned off to electrically disconnect transistor MN1 from transistor MP1. At the same time, transistor MP2 is turned on. As a result, signal GMP0 at the drain of transistor MP2 is pulled to voltage VWLP at the source of transistor MP2. Signal GMP0 is also at the gate of PMOS transistor MP0. As a result, transistor MP0 is turned off, and signal WL is electrically disconnected from signal VWLP. Effectively, signal EN enables or disables the boosting of signal WL.

The gate of PMOS transistor MP1 and NMOS transistor MN1 receive signal WL. As a result, based on the voltage level of signal WL, when PMOS transistor MP1 is on, NMOS transistor MN1 is off and vice versa. For example, when signal WL is logically low, PMOS transistor MP1 is turned on while NMOS transistor MN1 is turned off. In contrast, when signal WL is logically high, PMOS transistor MP1 is turned off while NMOS transistor MN1 is turned on. Effectively, transistors MN1 and MP1 each function as a voltage level detector for signal WL to turn on or off transistor MP0, and thereby activating or deactivating the boost for signal WL.

In some embodiments, transistor MN1 is turned on and transistor MP1 is turned off so that circuit 200A is in the boosting mode. During the transition of word line signal WL from a low logical value to a high logical value, transistor MN1 may not be fully turned on and/or transistor MP1 may not be fully turned off. As a result, transistor MN1, MN2, and MP1 are designed to compensate for the condition that transistor MN1 is not fully on and/or transistor MP1 is not fully off. In some embodiments, transistors MN1, MN2, and MP1 are designed such that the current flowing through transistors MN2, MN1, and MP1 is sufficient for node GMP0 to be pulled closer to voltage VBB at the source of transistor MN1. In some embodiments, sizes of transistors MN1, MN2, and MP1 are designed to provide a desired current. Effectively, the sizes and/or the currents of transistors MN1, MN2, and MP1 are designed so that node GMP0 is quickly pulled to voltage VBB. Transistor MP0 is therefore quickly turned on and pulls signal WL to node VWLP or to boost signal WL.

Table Illustrating Relationship of Various Signals

Figure 2B:
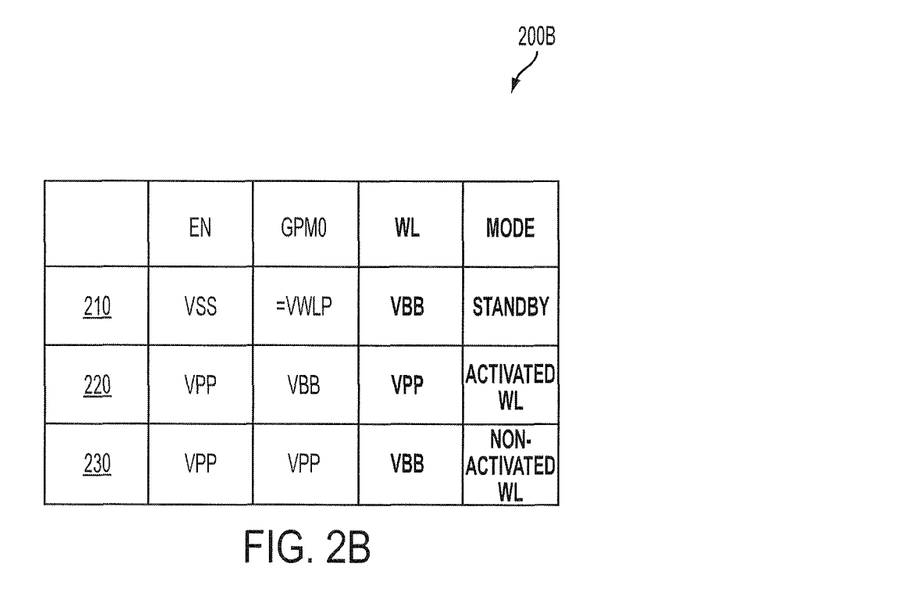
FIG. 2B is a graph of a table illustrating an operation of the word line booster circuit in FIG. 2A, in accordance with some embodiments.

FIG. 2B is a graph of a table 200B, in accordance with some embodiments. Table 200B is used to illustrate the relationships of various signals in FIG. 2A. In this illustration signal WL is activated when signal WL has a high logical value.

With reference to line 210, signal EN is logically low at voltage VSS. Word line WL is logically low at voltage VBB. Signal GMP0 is at voltage VWLP, and WL booster circuit 200A is in a standby mode.

With reference to line 220, signal EN is at voltage VPP. Signal GPM0 is at voltage VBB. Word line WL is at voltage VPP, and is activated.

With reference to line 230, signal EN is at voltage VPP. Signal GPM0 is at voltage VPP. Word line WL is at voltage VBB, and is non-activated.

Connection of a Word Line and a Memory Cell

Figure 2C:
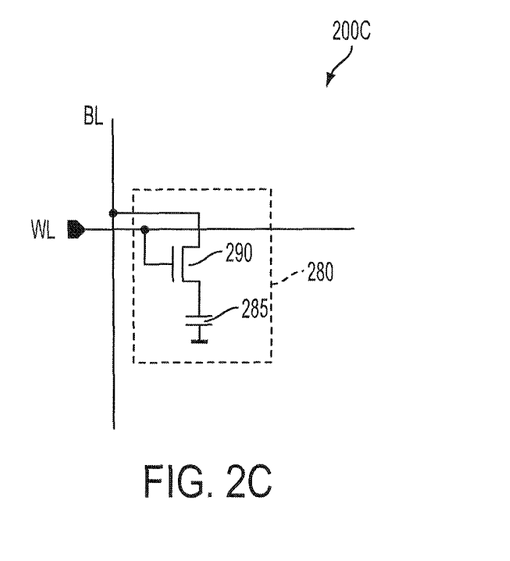
FIG. 2C is a graph of a memory circuit illustrating a connection between a word line and a memory cell, in accordance with some embodiments.

FIG. 2C is a memory circuit 200C, in accordance with some embodiments. Circuit 200C is used to illustrate a connection of a word line WL and a memory cell 285. In this illustration, signal WL is activated when signal WL is applied with a high logical value.

Bit cell 280 includes memory cell 285 and pass gate transistor 290. Pass gate transistor 290 allows access between memory cell 285 and bit line BL. In some embodiments, memory cell 285 is a capacitor storing charges. In a write cycle, applying a logic value to bit line BL and the opposite logical value to another bit line ZBL (not shown) enables writing the logic level at bit line BL to memory cell 285. In a read cycle, sensing or reading the logic values at bit line BL and bit line ZBL reveals the data stored in memory cell 285.

Word line WL is used to turn on or off memory pass gate transistor 290 to allow access to memory cell 285 through pass gate transistor 290. When word line WL at the gate of transistor 290 is deactivated or applied with a low logical value, transistor 290 is turned off. Memory cell 285 is therefore electrically disconnected from bit line BL. In contrast, when word line WL is activated or applied with a high logical value, transistor 290 is turned on. Memory cell 285 is electrically connected to bit line BL.

Word Line Booster Circuit, Some Further Embodiments

Figure 3A:
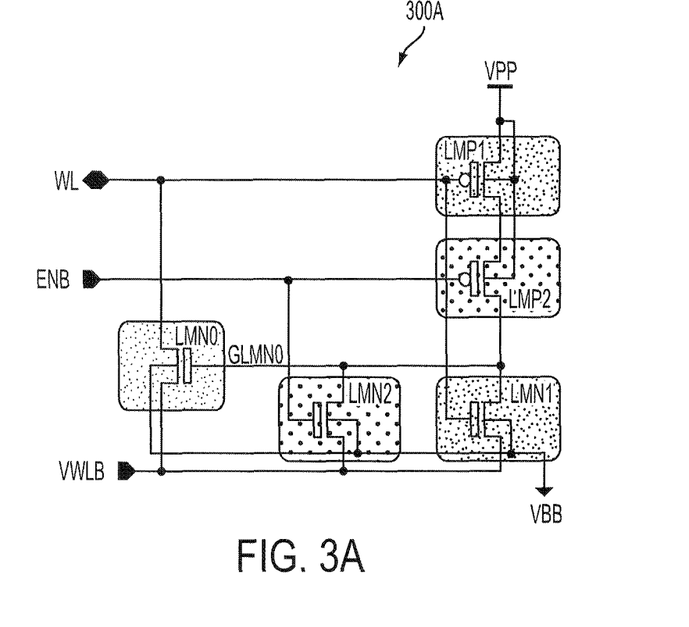
FIG. 3A is a diagram of word line booster circuit, in accordance with some further embodiments.

FIG. 3A is a diagram of a word line booster circuit 300A, in accordance with some embodiments. Circuit 300A illustrates an embodiment of a WL booster circuit 160 in FIG. 1 in which circuit 300A boosts signal WL when signal WL transitions from a high logical value to low logical value. In embodiments that signal WL is activated when signal WL is logically low, circuit 300A is used in activating signal WL. In embodiments that signal WL is activated when signal WL is logically high, circuit 300A is used in deactivating signal WL. To adapt to the voltage swing of signal WL from voltage VBB and VPP, transistors LMP1, LMP2, LMN0, LMN1, and LMN2 each have a thick gate oxide, and each have an operational voltage significantly higher than an operational voltage of core transistors, which have a thin gate oxide.

Compared with circuit 200A, NMOS transistors LMN0, LMN1, and LMN2 correspond to PMOS transistors MP0, MP1, and MP2 in circuit 200A. PMOS transistors LMP1 and LMP2 corresponds to NMOS transistor MN2 and MN2 in circuit 200A. Signal VWLB corresponds to signal VWLP in circuit 200A. Signal ENB corresponds to signal EN in FIG. 2A.

NMOS transistor LMN0 functions as a driver and a booster for signal WL. For example, when transistor LMN0 is turned on, signal WL at the drain of NMOS transistor LMN0 is pulled to signal VWLB at the source of transistor LMN0. At that time, signal VWLB is at voltage VBB. In other words, transistor LMN0 drives signal WL to voltage VBB, and thereby boosts signal WL. In some embodiments, transistor LMN0 is turned on to drive and thus boost signal WL based on the voltage level of signal WL. For example, when signal WL transitions from a high voltage value of voltage VPP towards a low voltage value of voltage VBB. At that time, PMOS transistor LMP2 is also turned on. When signal WL reaches the threshold voltage of PMOS transistor LMP1, the current through transistor LMP1 increases and the current through NMOS transistor LMN1 decreases. When signal WL reaches low voltage VBB, NMOS transistor LMN1 is turned off completely while PMOS transistor LMP1 is turned on completely. As a result, signal GLMN0 at the drain of PMOS transistor LMP2 is pulled to voltage VPP at the source of transistor LMP1. Signal GLMN0 is also at the gate of NMOS transistor LMN0. Transistor LMN0 is therefore turned on, which pulls signal WL to voltage VWLB. In other words, signal WL is boosted.

NMOS transistor LMN2 and PMOS transistor LMP2 together function as control devices. The gates of NMOS transistor LMN2 and PMOS transistor LMP2 are coupled together, and are configured to receive signal ENB. As a result, when NMOS transistor LMN2 is on, PMOS transistor LMP2 is off, and vice versa. For example, when signal ENB is logically low, NMOS transistor LMN2 is turned off, and is electrically disconnected from other circuits in WL booster circuit 200A. Signal GLMN0 at the gate of transistor LMN0 is independent of transistor LMN2 and thus voltage VWLB. At the same time, transistor LMP2 is turned on to electrically connect transistors LMN1 and LMP1 for transistors LMN1 and LMP1 to perform their function. For example, when both PMOS transistors LMP1 and LMP2 are on, and NMOS transistor LMN1 is off, PMOS transistors LMP1 and LMP2 pull signal GLMN0 at the drain of transistor LMP2 to voltage VPP at the source of transistor LMP1.

When signal ENB is logically high, however, transistor LMP2 is turned off to electrically disconnect transistor LMP1 from transistor LMN1. At the same time, transistor LMN2 is turned on. As a result, signal GLMN0 at the drain of transistor LMN2 is pulled to voltage VWLB at the source of transistor LMN2. Signal GLMN0 is also at the gate of NMOS transistor LMN0. As a result, transistor LMN0 is turned off, and signal WL is electrically disconnected from signal VWLB. Effectively, signal ENB enables or disables the boosting of signal WL.

The gate of NMOS transistor LMN1 and PMOS transistor LMP1 receive signal WL. As a result, based on the voltage level of signal WL, when NMOS transistor LMN1 is on, PMOS transistor LMP1 is off and vice versa. For example, when signal WL is logically low, NMOS transistor LMN1 is turned on while PMOS transistor LMP1 is turned off. In contrast, when signal WL is logically high, NMOS transistor LMN1 is turned off while PMOS transistor LMP1 is turned on. Effectively, transistors LMP1 and LMN1 each function as a voltage level detector for signal WL to turn on or off transistor LMN0, and thereby activating or deactivating the boost for signal WL.

In some embodiments, transistor LMP1 is turned on and transistor LMN1 is turned off so that circuit 300A is in the boosting mode. During the transition of word line signal WL from a high logical value to a low logical value, transistor LMP1 may not be fully turned on and/or transistor LMN1 may not be fully turned off. As a result, transistor LMP1, LMP2, and LMN1 are designed to compensate for the condition that transistor LMP1 is not fully on and/or transistor LMN1 is not fully off. In some embodiments, transistors LMP1, LMP2, and LMN1 are designed such that the current flowing through transistors LMP1, LMP2 is sufficient for node GLMN0 to be pulled closer to voltage VPP at the source of transistor LMP1. In some embodiments, sizes of transistors LMP1, LMP2, and LMN1 are designed to provide the desired current. Effectively, the sizes and/or the currents of transistors LMP1, LMP2, and LMN1 are designed so that node GLMN0 is quickly pulled to voltage VPP. Transistor LMN0 is therefore quickly turned on and pulls signal WL to node VWLB or to boost signal WL.

Table Illustrating Relationship of Various Signals

Figure 3B:
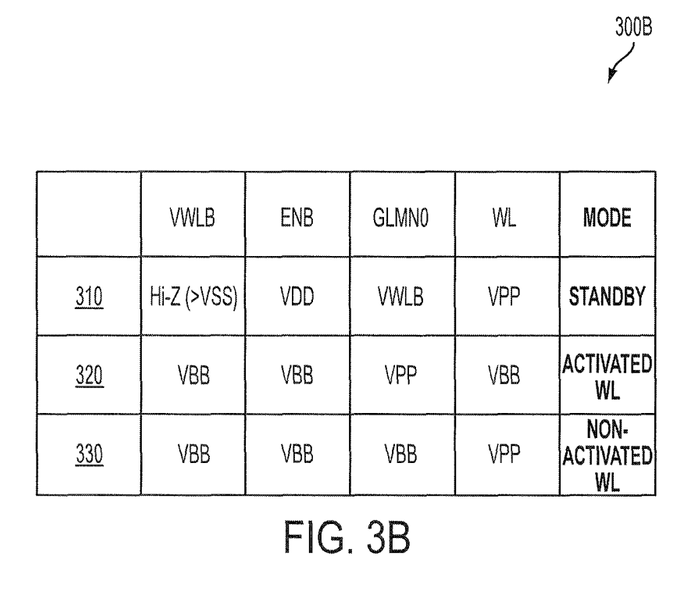
FIG. 3B is a graph of a table illustrating an operation of the word line booster circuit in FIG. 3A, in accordance with some embodiments.

FIG. 3B is a graph of a table 300B, in accordance with some embodiments. Table 300B is used to illustrate the relationships of various signals in FIG. 3A. In this illustration, signal WL is activated when signal WL has a low logical value.

With reference to line 310, signal ENB is logically high at voltage VDD. Word line WL is logically high at voltage VPP. Signal GLMN0 is at voltage VWLB, and WL booster 300A is in a standby mode.

With reference to line 320, node VWLB is at voltage VBB. Signal ENB is at voltage VBB. Signal GLMN0 is at voltage VPP. Word line WL is at voltage VBB, and is activated.

With reference to line 320, node VWLB is at voltage VBB. Signal ENB is at voltage VBB. Signal GLMN0 is at voltage VBB. Word line WL is at voltage VPP, and is non-activated.

Connection of a Word Line and a Memory Cell

Figure 3C:
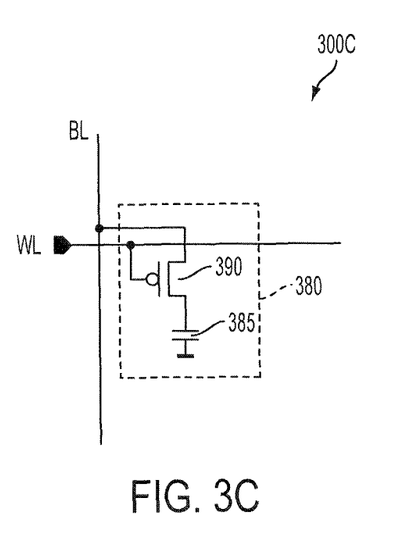
FIG. 3C is a graph of a memory circuit illustrating a connection between a word line and a memory cell, in accordance with some further embodiments.

FIG. 3C is a memory circuit 300C, in accordance with some embodiments. Circuit 300C is used to illustrate a connection of a word line WL and a memory cell 385. In this illustration, signal WL is activated when signal WL is applied with a low logical value.

Compared with circuit 200C, word line WL in circuit 300C is active low. As a result, pass gate transistor 390 is a PMOS transistor instead of an NMOS transistor like transistor 290 in circuit 200C. For example, when word line WL at the gate of transistor 390 is deactivated or applied with a high logical value, transistor 390 is turned off. Memory cell 385 is therefore electrically disconnected from bit line BL. In contrast, when word line WL is activated or applied with a low logical value, transistor 390 is turned on. Memory cell 385 is electrically connected to bit line BL.

Exemplary Method

Figure 4:
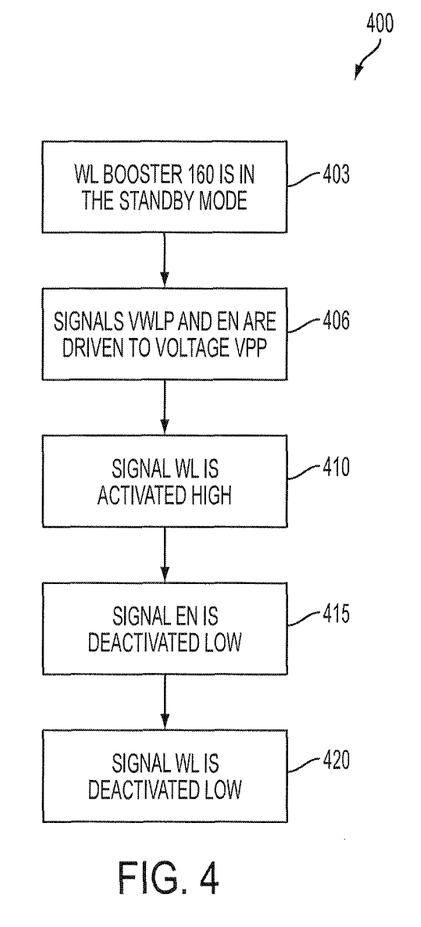
FIG. 4 is a flowchart of a method illustrating an operation of the word line booster circuit in FIG. 2A, in accordance with some embodiments.

FIG. 4 is a flowchart of a method 400 illustrating an operation of WL booster circuit 200A, in accordance with some embodiments. Circuit 200A is used for illustration, operations of circuit 300A are similar to that of circuit 200A.

In this illustration, initially in operation 403, WL booster 160 is in the standby mode. Signal VWLP is not driven and floated to reduce leakage current. In some embodiments, signal VWLP is at a voltage below operational voltage VDD. Word lines WL in FIG. 1 are non-active and stay at voltage VBB. Transistor MN1 is therefore off, and transistor MP1 is on. Signal EN is also non-active with a low logical value. Transistor MN2 is off and transistor MP2 is on. As a result, signal GMP0 is pulled to voltage VWLP at the sources of PMOS transistors MP2 and MP1.

In operation 406, signal VWLP is driven to voltage VPP. Signal EN is also driven to voltage VPP. As a result, PMOS transistor MP2 is off and NMOS transistor MN2 is on. At that time, signal WL is still at voltage VBB. Transistor MN1 is therefore off, and transistor MP1 is still on. Consequently, signal GMP0 is pulled to voltage VPP of signal VWLP at the source of transistor MP1.

In operation 410, signal WL is activated with a high logical value at voltage VPP. As a result, transistor MN1 is turned on. Transistor MN2 has been on. As a result, signal GMP0 is pulled to voltage VBB at the source of transistor MN1. Transistor MP0 is therefore turned on, which pulls signal WL to voltage VPP at the source of transistor MP0. Effectively, signal WL is boosted by transistor MP0.

In operation 415, signal EN is deactivated with a low logical value of voltage VSS. As a result, PMOS transistor MP2 is turned on while NMOS transistor MN2 is partially turned off. Signal GMP0 at the drain of PMOS transistor MP2 is pulled to voltage VPP at the source of PMOS transistor MP2. Signal GMP0 is also at the gate of transistor MP0. As a result, transistor MP0 is turned off. Current also starts to leak from node GMP0 to node VBB at the source of transistor MN1. At the same time, signal WL is electrically disconnected from voltage VPP at the source of transistor MP0. As a result, signal WL is pulled to voltage VBB by a corresponding WL driver circuit 140. Transistor MN1 is therefore turned off, and the leakage current originating from node GPM0 stops.

In operation 420, signal WL is deactivated low. A cycle including activation and deactivation of signal WL is complete.

Exemplary Waveforms

Figure 5:
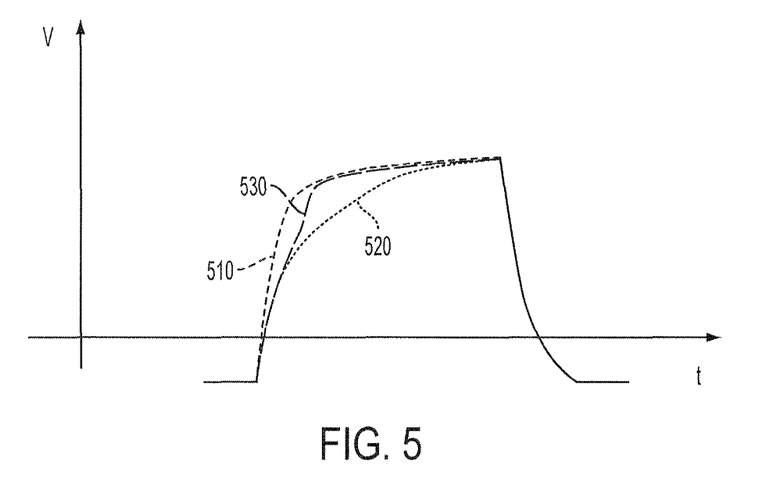
FIG. 5 is a graph of waveforms illustrating the advantages of the word line booster circuit in FIG. 2A, in accordance with some embodiments.

FIG. 5 is a graph of waveforms illustrating the advantages of a WL booster circuit 160, in accordance with some embodiments. For illustration, signal $WL_1$ and corresponding WL driver $140_1$ and WL booster $160_1$ in FIG. 1 are used. The operation of other WL boosters 160 is similar to that of WL booster $160_1$. The Y axis for waveforms 510, 520, and 530 is in a voltage unit represented by V. The X axis is in a time unit represented by t.

Waveform 510 represents signal $WL_1$ at the output corresponding WL driver $140_1$. Waveform 520 represents signal $WL_1$ at the input of corresponding WL booster $160_1$ without the existence of WL booster $160_1$. Waveform 530 represents signal $WL_1$ at the input of the corresponding WL booster $160_1$ with the existence of WL booster $160_1$ in accordance with various embodiments of the disclosure.

Compared with waveform 510, waveform 520 is degraded. As illustratively shown, the rise time of waveform 520 is slower than that of waveform 510. In other words, the rise time of signal $WL_1$ when reaching the end of word line $WL_1$ or the input of WL booster $160_1$ without the assistance of WL booster $160_1$ is slower than the rise time of signal $WL_1$ at the output of the corresponding WL driver $140_1$.

Compared with waveform 520, waveform 530 is boosted. The rise time of waveform 530 is faster than the rise time of waveform 520. In other words, booster $160_1$ speeds up the rise time of signal $WL_1$ when signal $WL_1$ reaches booster $160_1$ or the end of the corresponding word line $WL_1$. As a result, various embodiments of the disclosure are advantageous because, in some embodiments, signals WL are each used to access a corresponding memory cell. As the rise time of signals WL is sped up, accessing the memory cell is faster.

In FIGS. 4 and 5, circuit 200A is used for illustration. The operation of circuit 300A is similar to that of circuit 200A.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration. Embodiments of the disclosure are not limited to a particular type. Selecting different dopant types for a particular transistor is within the scope of various embodiments. The low or high logical value of various signals used in the above description is also for illustration. Various embodiments are not limited to a particular level when a signal is activated and/or deactivated. Selecting different levels is within the scope of various embodiments.

In some embodiments related to a method for boosting a word line signal, the word line signal is transitioned from a first voltage value of the word line signal to a second voltage value of the word line signal, thereby turning on a first transistor. The first transistor and a second transistor turn on a third transistor. The third transistor causes the word line signal at a first terminal of the third transistor to reach a voltage value at a second terminal of the third transistor, thereby causing the word line signal to reach the voltage value faster than without the third transistor. The first transistor and the second transistor are coupled in series.

In some embodiments, a word line booster circuit comprises a first transistor, a second transistor, a third transistor, a fourth transistor, a fifth transistor, and a word line. The first transistor is coupled in series with the second transistor. The second transistor is coupled in series with the fourth transistor. The fourth transistor is coupled in parallel with the fifth transistor. The word line is coupled to a first terminal of the third transistor and a third terminal of the first transistor. A second terminal of the third transistor is coupled to a second terminal of the fourth transistor and a second terminal of the fifth transistor. A third terminal of the third transistor is coupled to the second transistor, the fourth transistor, and the fifth transistor.

In some embodiments, a circuit comprises a word line driver circuit, a word line booster circuit, and a word line. The word line is coupled to an output of the word line driver circuit, to a plurality of memory cells, and to an input of the word line booster circuit. The word line booster circuit is configured to cause a word line signal on the word line to reach a first voltage value of the word line signal when the word line signal transitions from a second voltage level towards the first voltage level different from the second voltage level.

In some embodiments related to a method for boosting a word line signal, a first signal is caused to reach a first voltage value of the first signal. A second signal is caused to reach a first voltage value of the second signal, thereby turning on a first transistor. The word line signal is transitioned toward a first voltage value of the word line signal. A voltage level of the word line signal causes a second transistor and a third transistor to turn on. The third transistor pulls the word line signal to the first voltage value of the word line signal. The second signal is caused to reach a second voltage value of the second signal, thereby turning off the first transistor and the third transistor. The word line signal is caused to reach a second voltage value of the word line signal, thereby turning off the second transistor.

The above illustration includes exemplary steps, but the steps are not necessarily performed in the order shown. Steps may be added, replaced, changed order, and/or eliminated as appropriate, in accordance with the spirit and scope of disclosed embodiments.

What is claimed is:

1. A method for boosting a word line signal, comprising:
   transitioning the word line signal from a first voltage value of the word line signal to a second voltage value of the word line signal, thereby turning on a first transistor;
   turning on a third transistor responsive to a voltage at a terminal of a second transistor after the first and second transistors are turned on; and
   the third transistor causing the word line signal at a first terminal of the third transistor to reach a voltage value at a second terminal of the third transistor, thereby causing the word line signal to reach the voltage value at the second terminal of the third transistor faster than without the third transistor,
   wherein
   the first transistor and the second transistor are coupled in series.

2. The method of claim 1, wherein
   the word line signal is at a gate of the first transistor;
   a drain of the first transistor is coupled to a source of the second transistor;
   a gate of the third transistor is coupled to a drain of the second transistor;
   the first terminal of the third transistor is a drain of the third transistor;
   the second terminal of the third transistor is a source of the third transistor.

3. The method of claim 2, wherein
   the first transistor and the second transistor are each an NMOS transistor, and the third transistor is a PMOS transistor, or
   the first transistor and the second transistor are each a PMOS transistor, and the third transistor is an NMOS transistor.

4. The method of claim 1, further comprising turning off the second transistor and third transistor after the word line signal reaches a predetermined voltage value.

5. The method of claim 1, wherein
   a first terminal of a fourth transistor is coupled to a third terminal of the third transistor and a first terminal of the second transistor;
   a second terminal of the fourth transistor is coupled to a second terminal of the third transistor;
   a first terminal of a fifth transistor is coupled to the first terminal of the fourth transistor;
   a second terminal of the fifth transistor is coupled to the second terminal of the third transistor; and
   the first terminal of the third transistor and a third terminal of the fifth transistor are coupled together and configured to receive the word line signal.

6. The method of claim 1, before transitioning the word line signal from the first voltage value of the word line signal to the second voltage value of the word line signal, further comprising:
   causing a first signal to reach a first voltage value of the first signal; and
   causing a second signal to reach a first voltage value of the second signal.

7. The method of claim 6, wherein
   a source of the third transistor is configured to receive the first signal; and a gate of the second transistor is configured to receive the second signal.

8. The method of claim 1, further comprising:
before transitioning the word line signal from the first voltage value of the word line signal to the second voltage value of the word line signal, causing a first signal to reach a first voltage value of the first signal and causing a second signal to reach a first voltage value of the second signal; and
after the word line signal reaches the second voltage value of the word line signal, causing the second signal to reach a second voltage value of the second signal and transitioning the word line signal from the second voltage value of the word line signal to the first voltage value of the word line signal.

9. The method of claim 1, wherein
the word line signal transitioning from the first voltage value of the word line signal to the second voltage value of the word line signal causes a memory cell to be electrically coupled to a word line carrying the word line signal; and
the word line signal transitioning from the second voltage value of the word line signal to the first voltage value of the word line signal causes the memory cell to be electrically disconnected from the word line.

10. A word line booster circuit comprising:
a first transistor;
a second transistor;
a third transistor;
a fourth transistor;
a fifth transistor; and
a word line,
wherein
the first transistor is coupled in series with the second transistor;
the second transistor is coupled in series with the fourth transistor;
the fourth transistor is coupled in parallel with the fifth transistor;
the word line is coupled to a first terminal of the third transistor and a third terminal of the first transistor;
a second terminal of the third transistor is coupled to a second terminal of the fourth transistor and a second terminal of the fifth transistor; and
a third terminal of the third transistor is coupled to the second transistor, the fourth transistor, and the fifth transistor.

11. The word line booster circuit of claim 10, wherein
the first transistor and the second transistor are each an NMOS transistor, and the third transistor, the fourth transistor, and the fifth transistor are each a PMOS transistor; or
the first transistor and the second transistor are each a PMOS transistors, and the third transistor, the fourth transistor, and the fifth transistor are each an NMOS transistor.

12. The word line booster circuit of claim 10, wherein
a third terminal of the second transistor and a third terminal of the fifth transistor are coupled together and configured to receive a signal for use in enabling and disabling boosting of the word line.

13. The word line booster circuit of claim 10, wherein
the first transistor is configured to provide a voltage at a second terminal of the first transistor as a first logical value for the word line; and
the third transistor is configured to provide a voltage at a second terminal of the third transistor as a second logical value for the word line.

14. The word line booster circuit of claim 10, wherein
a first end of the word line is coupled to a word line driver circuit;
a second end of the word line is coupled to the word line booster circuit;
the word line driver circuit is configured to provide a word line signal on the word line; and
the word line booster circuit is configured to boost the word line signal.

15. The word line booster circuit of claim 10, wherein
the word line booster circuit is configured to boost a word line signal on the word line when the word line signal transitions from a first voltage value to a second voltage value to electrically couple a memory cell to the word line; or
the word line booster circuit is configured to boost the word line signal when the word line signal transition from the first voltage value to the second voltage value to electrically disconnect the memory cell from the word line.

16. A word line circuit comprising:
a word line driver circuit;
a word line booster circuit;
a word line coupled to an output of the word line driver circuit, to a plurality of memory cells, and to an input of the word line booster circuit,
wherein
the word line drive circuit is configured to generate a word line signal on the word line at the output of the word line driver circuit, the word line signal transitioning from a first voltage value to a second voltage value different from the first voltage value; and
the word line booster circuit is configured to cause the word line signal at the input of the word line booster circuit to reach a predetermined voltage value when the word line signal at the input of the word line booster circuit reaches a third voltage value in between the first voltage value and the second voltage value.

17. The circuit of claim 16, wherein
the word line booster circuit includes a first transistor, a second transistor, a third transistor, a fourth transistor, and a fifth transistor;
the first transistor is coupled in series with the second transistor;
the second transistor is coupled in series with the four transistor;
the fourth transistor is coupled in parallel with the fifth transistor;
the word line is coupled to a first terminal of the third transistor and a third terminal of the first transistor;
a second terminal of the third transistor is coupled to a second terminal of the fourth transistor and a second terminal of the fifth transistor; and
a third terminal of the third transistor is coupled to the second transistor, the fourth transistor, and the fifth transistor.

18. The circuit of claim 16, wherein
the word line booster circuit includes a first transistor, a second transistor, and a third transistor;
the first transistor and the second transistor are coupled in series;
a gate of the third transistor is coupled to the second transistor; and a drain of the third transistor is coupled to a gate of the first transistor and the word line.

19. A method for boosting a word line signal, comprising:
causing a first signal to reach a first voltage value of the first signal;
causing a second signal to reach a first voltage value of the second signal, thereby turning on a first transistor;
transitioning the word line signal towards a first voltage value of the word line signal, a voltage level of the word line signal causes a second transistor and a third transistor to turn on, the third transistor pulling the word line signal to the first voltage value of the word line signal;
causing the second signal to reach a second voltage value of the second signal, thereby turning off the first transistor and the third transistor; and
causing the word line signal to reach a second voltage value of the word line signal, thereby turning off the second transistor.

20. The method of claim 19, wherein at least one of a first group of conditions and a second group of conditions is met:
the first group of conditions includes
    the first voltage value of the first signal is a high voltage value of the first signal;
    the first voltage value of the second signal is a high voltage value of the second signal;
    the first voltage value of the word line signal is a high voltage value of the word line signal;
    the second voltage value of the second signal is a low voltage value of the second signal; and
    the second voltage value of the word line signal is a low voltage value of the second signal; and
the second group of conditions includes
    the first voltage value of the first signal is a low voltage value of the first signal;
    the first voltage value of the second signal is a low voltage value of the second signal;
    the first voltage value of the word line signal is a low voltage value of the word line signal;
    the second voltage value of the second signal is a high voltage value of the second signal; and
    the second voltage value of the word line signal is a high voltage value of the second signal.

\* \* \* \* \*